United States Patent [19]

Takahashi

[11] Patent Number: 4,831,330

[45] Date of Patent: May 16, 1989

[54] PROBE FOR MAGNETIC RESONANCE IMAGING SYSTEM

[75] Inventor: Jun Takahashi, Ootawara, Japan

[73] Assignee: Kabushiki Kaisha Toshiba, Kawasaki, Japan

[21] Appl. No.: 917,898

[22] Filed: Oct. 10, 1986

[30] Foreign Application Priority Data

Oct. 14, 1985 [JP] Japan .................................. 60-226855

[51] Int. Cl.$^4$ ............................................. G01R 33/20
[52] U.S. Cl. .................................... 324/318; 128/653
[58] Field of Search ............... 324/300, 307, 309, 318, 324/320, 322; 128/653

[56] References Cited

U.S. PATENT DOCUMENTS

| 4,362,993 | 12/1982 | Young et al. | 324/320 |
| 4,621,237 | 11/1986 | Timms | 324/318 |
| 4,649,348 | 3/1987 | Flugan | 324/318 |
| 4,652,824 | 3/1987 | Oppelt | 324/318 |
| 4,691,163 | 9/1987 | Blass et al. | 128/653 |
| 4,712,067 | 12/1987 | Roschmann et al. | 324/318 |

FOREIGN PATENT DOCUMENTS 0154360  9/1985  European Pat. Off. .

Primary Examiner—Michael J. Tokar
Assistant Examiner—Kevin D. O'Shea
Attorney, Agent, or Firm—Foley & Lardner, Schwartz, Jeffery, Schwaab, Mack, Blumenthal & Evans

[57] ABSTRACT

In an MRI system, a patient is placed in a uniform static field, and a gradient field is superposed on the uniform static field and an excitation rotating field is applied thereto, thus causing an MR phenomenon in a prospective slice portion of the patient. The MRI system detects an MR signal generated by the MR phenomenon, and causes the detected MR signal to be subjected to predetermined processing including image reconstruction processing, thus obtaining slice image data to which MR data in the slice of the patient is reflected. A reception probe is used for detecting the MR signal in the MRI system. The reception probe essentially consists of a coil member without a bobbin.

9 Claims, 4 Drawing Sheets

PROBE FOR MAGNETIC RESONANCE IMAGING SYSTEM

BACKGROUND OF THE INVENTION

The present invention relates to a magnetic resonance imaging (MRI) system which generates a magnetic resonance (MR) in an object to be examined, detects an MR signal in accordance with the MR, and performs processing including image reconstruction processing, the image reconstruction processing being established by computed tomography, thereby obtaining a distribution image of MR data in a selected slice in the object and, more particularly, to an improvement of a reception probe for detecting an MR signal excited in an object to be examined in an MRI system mainly used in medical examination.

In an MRI system, an object to be examined is placed in a uniform static field, and an inclined magnetic field is superposed on the uniform static field and an excitation rotating field is applied thereto, thereby causing an MR phenomenon in a prospective slice portion of the object. An MR signal generated by the MR phenomenon is detected, and is subjected to predetermined processing including image reconstruction processing, thereby obtaining a slice image to which MR data in a slice of the object is reflected. As the MRI system, a medical diagnosis system is widely known.

In MRI examination, an appropriate combination of magnetic fields, which are generated by a magnet device including coils, is applied to an object to be examined. An MR excited upon application of the combination of magnetic fields is detected by at least one reception coil system. An MR signal detected by the reception coil system is subjected to predetermined processing in order to obtain MR image data.

An imaging operation in an MRI system will be schematically described with reference to FIG. 1 showing a conventional MRI diagnosis system. The object to be examined (patient) P is placed in satisfactorily uniform static field H0 along a Z axis in FIG. 1, which is generated by a static field generator (not shown). Gradient field Gz along the Z axis in FIG. 1 is added to static field H0 by a pair of inclined magnetic field coils 11A and 11B. These Z axis inclined magnetic field coils 11A and 11B are formed by, e.g., a pair of Helmholtz coils. A magnetic field intensity distribution in which a magnetic field intensity differs in accordance with displacement along the Z axis is obtained by gradient field Gz along the Z axis. An RF rotating field of angular frequency $\omega 0$ which can resonate specific nuclei, i.e., excitation pulse H1, is applied to patient P by a transmission probe. The transmission probe comprises a pair of transmission coils 12A and 12B arranged in, e.g., a probe head. These coils 12A and 12B comprise a pair of saddle coils, a shown in FIG. 1. RF excitation pulse H1 is applied to patient P through coils 12A and 12B. When pulse H1 is applied, an MR phenomenon occurs only in slice portion S (which is a planar portion, but has a given thickness in practice) perpendicular to the Z axis selectively determined along the Z axis by gradient field Gz. The MR phenomenon is detected as an MR signal by a reception probe. The reception probe comprises reception coils 13A and 13B arranged in, e.g., the probe head. The MR signal detected by coils 13A and 13B is a free induction delay (FID) signal or a spin echo signal. The MR signal (the FID or spin echo signal) detected by coils 13A and 13B depends on an MR excitation method (excitation pulse sequence). In order to obtain a slice image consisting of MR data in slice portion S, two-dimensional position data on the plane of slice portion S is necessary. For this reason, in order to add the two-dimensional position data to the MR signal, after slice portion S is excited to cause the MR phenomenon, gradient field Gxy having gradients in various directions on the X-Y plane is applied to field H0 by coils (not shown). The thus detected MR signal is subjected to predetermined processing, e.g., two-dimensional Fourier transform, thereby reconstructing a slice image consisting of the MR data in slice portion S.

In the conventional MRI system, the probe head is arranged inside coils for generating static and gradient fields, and serves as a transmission/reception probe. A pair of saddle coils (serving both as transmission and reception coils) are arranged in the probe head to surround a patient.

The probe head applies an RF field for exciting an MR phenomenon to a patient, as a transmission probe, and detects a weak MR signal from the patient, as a reception probe. For this reason, the probe head is preferably arranged as near the patient as possible for higher efficiency.

In the conventional probe head, a pair of saddle coils 22A and 22B are arranged on cylindrical bobbin 21, as shown in FIG. 2. Saddle coils 22A and 22B in probe head 23 are connected to each other, as shown in FIG. 2. Probe head 23 is used such that the abdomen of patient P is placed inside head 23, as shown in FIG. 3.

However, with probe head 23 having the above arrangement, the space between head 23 and patient P must be widened so that patient P lying on a bed for diagnosis does not experience anxiety or feel cramped. For this reason, since the distance between patient P and head 23 becomes large, head 23 does not always have a best shape as a reception probe for receiving, in particular, a MR signal which is usually weak.

Since conventional head 23 has a cylindrical shape, coils generating static and gradient fields are arranged inside a gantry incorporated therein, and patient P is inserted and lies therein to have a predetermined positional relationship with head 23. For this reason, an operation for setting patient P to obtain the predetermined positional relationship with head 23 is very cumbersome.

Since bobbin 21 is normally formed of plastic as a dielectric, loss occurs upon reception of a weak RF signal, i.e., an MR signal.

SUMMARY OF THE INVENTION

It is an object of the present invention to provide a probe for an MRI system which can be easily arranged on an object to be examined to be in tight contact therewith so that the object does not feel anxiety or cramped, can improve resultant MR image quality, and allows easy positioning of the object.

In a probe for an MRI system according to the present invention, a reception probe used for detecting an MR signal comprises a reception coil essentially consisting only of a coil member without a bobbin.

According to the probe for the MRI system of the present invention, since no bobbin is used, the reception coil constituting the reception probe can be arranged to be in tight contact with the object, and attenuation of the received MR signal can be reduced.

Since no bobbin is required, the reception probe can be lightweight. Since the reception probe consists almost only of a coil member, even if it is arranged to be in tight contact with the object, it does not cause the object to feel anxiety or cramped, and can be easily mounted thereon.

In addition, since no plastic bobbin is used for holding coils of the reception probe, there is no dielectric between the reception coil and the object, and electric loss due to the dielectric can be reduced. Therefore, signal attenuation can also be reduced, thus improving a reception sensitivity and obtaining good image quality.

DETAILED DESCRIPTION OF THE PREFERRED EMBODIMENTS

Figure 4A:
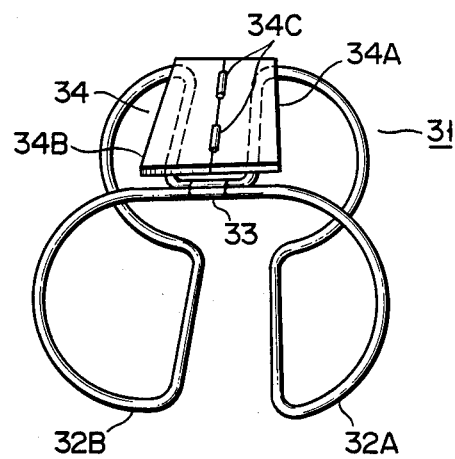
FIGS. 4A and 4B are perspective views, viewed in different directions, showing the arrangement of a probe according to a first embodiment of the present invention.
Figure 4B:
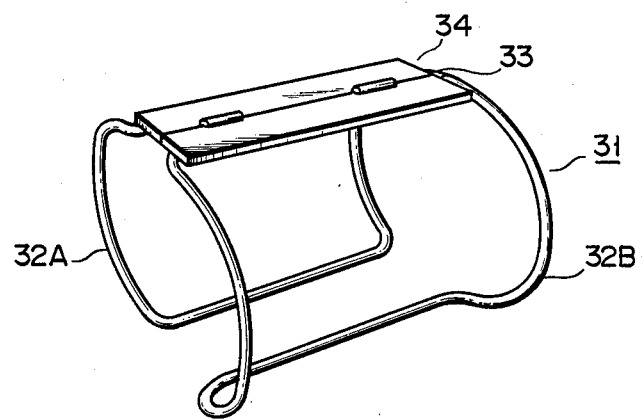

A probe for an MRI system according to a first embodiment of the present invention is arranged as shown in FIGS. 4A and 4B. As shown in FIGS. 4A and 4B, reception probe 31 uses no bobbin, and comprises a pair of saddle coil members 32A and 32B, flexible coupling portion 33, and holding member 34. Members 32A and 32B are formed of a rigid conductor (which cannot easily be bent), typically, a copper pipe having a sufficient diameter and wall thickness or a copper rod having a sufficient diameter. Coupling portion 33 for coupling these coil members 32A and 32B is formed of a flexible conductor, typically, a flexible copper foil or copper braid. Coil members 32A and 32B are fixed to holding member 34 adjacent to coupling portion 33. In holding member 34, a pair of holding plates 34A and 34b are coupled through hinge 34C to be pivotal through a predetermined angle. Coil members 32A and 32B are fixed to holding member 34 so that a bent portion by hinge 34C coincides with that by coupling portion 33. Holding member 34 restricts a movable deformation range when coupling portion 33 is bent, and can accurately hold a relative positional relationship between coil members 32A and 3BB upon imaging, i.e., upon reception of an MR signal. Although not shown, coil members 32A and 32B are connected to a detection circuit through a flexible lead wire connected adjacent to coupling portion 33. Therefore, reception probe 31 can be held only by mounting on patient P, and is not mechanically coupled to other arrangements of the MRI system.

Figure 5:
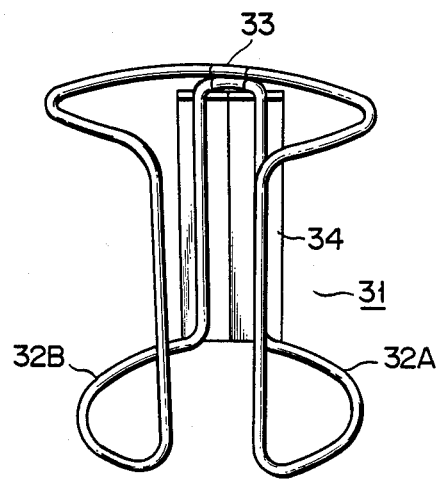
FIGS. 5 and 6 are perspective views showing closed and open states of the probe shown in FIG. 4A.
Figure 6:
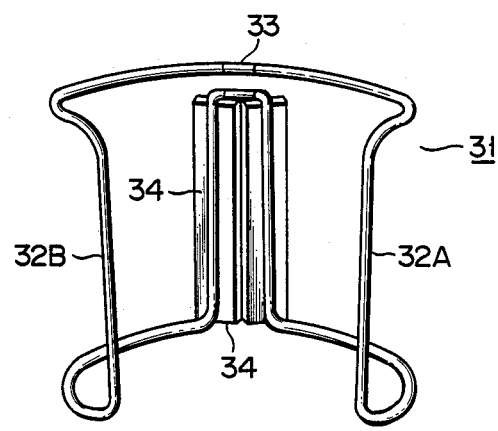

When hinge 34C and coupling portion 33 of holding member 34 are bent, reception probe 31 with the above arrangement can be both in a state shown in FIG. 5 wherein coil members 32A and 32B are closed and in a state shown in FIG. 6 wherein members 32A and 32B are open (to the right and left in FIG. 6.. In the closed state shown in FIG. 5, an appropriate engaging mechanism (although not shown, a known arrangement can be adopted) is arranged on hinge 34C of holding member 34 so as to hold that state.

Figure 7:
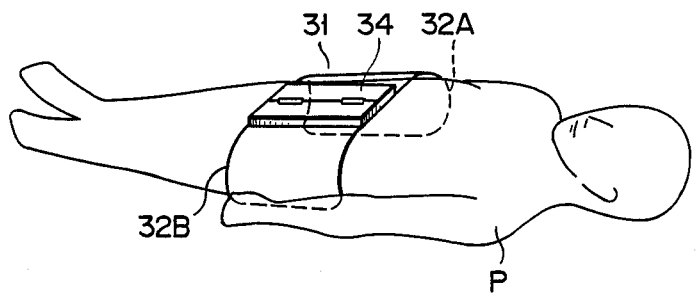
FIG. 7 is a perspective view illustrating a state wherein the probe shown in FIG. 4A is mounted on an object to be examined.

Reception probe 31 is mounted on patient P so that patient P is placed between coil members 32A and 32B while members 32A and 32B are open, as shown in FIG. 6, and members 32A and 32B are then closed, as shown in FIG. 5. When probe 31 is mounted on patient P, coil members 32A and 32B are in tight contact with patient P, as shown in FIG. 7.

Therefore, since reception probe 31 is arranged in tight contact with patient P and no bobbin is present between coil members 32A and 32B and patient P, electric loss due to plastic (permittivity) can be eliminated, and attenuation of a received signal can be reduced. Therefore, an S/N ratio can be improved, and MR image quality obtained by the MRI system using reception probe 31 can also be improved.

Figure 1:
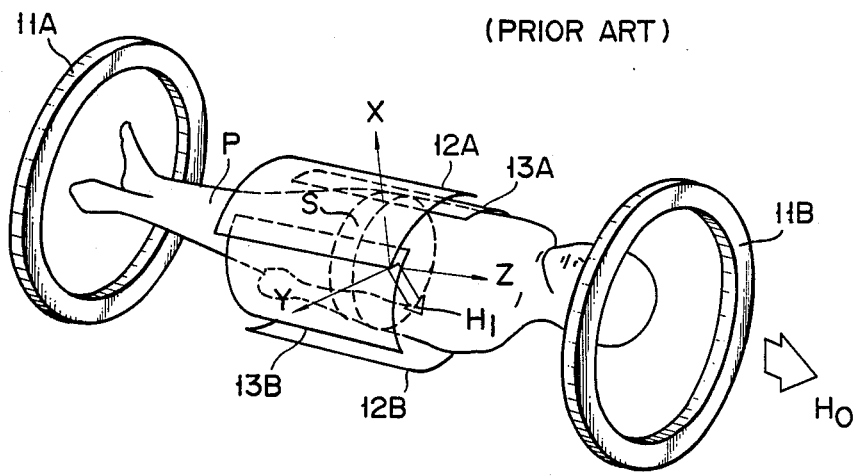
FIG. 1 is a representation for explaining the principle of an MRI system.
Figure 2:
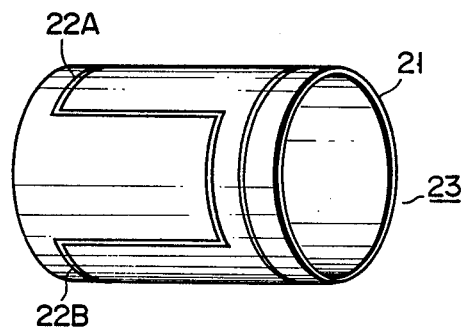
FIG. 2 is a perspective view schematically showing the arrangement of a transmission/reception probe in a conventional system.
Figure 3:
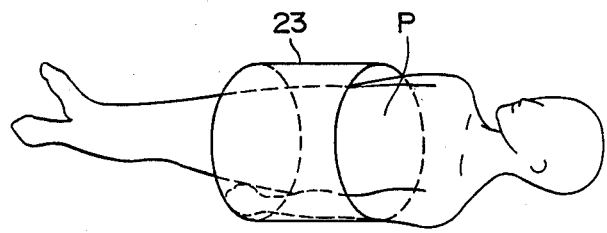
FIG. 3 is a representation showing a state wherein the probe shown in FIG. 2 is mounted on an object to be examined.

A transmission/reception probe in a conventional system shown in FIG. 2 can be used as a transmission probe. In this case, the transmission/reception probe is used as the transmission probe, and as the reception probe, the transmission/reception probe and the reception probe of the present invention can be selectively used according to an object to be imaged. As a practical matter of course, a special-purpose transmission probe having the same arrangement as that of the transmission/reception probe in the conventional system shown in FIG. 2 can be used.

Since a transmission probe coil deals with a high signal power and can easily influence static and gradient fields for exciting an MR phenomenon, it must be a coil which will not change its position and shape. For this reason, the transmission probe coil is preferably one having a bobbin as in a conventional system. In contrast to this, since the reception probe detects a weak MR signal, it is preferably arranged as near the patient as possible to obtain a high detection sensitivity. In this respect, reception probe 31 employing the present invention is very advantageous.

Figure 8:
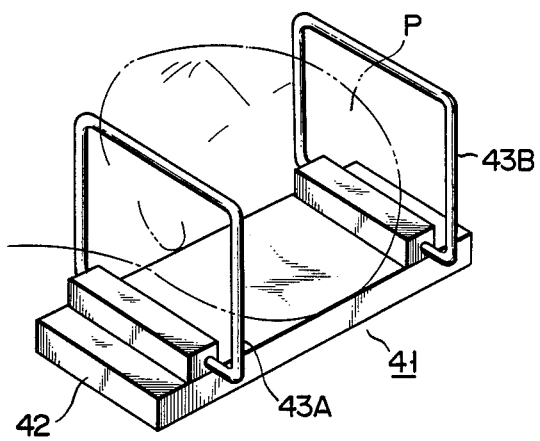
FIG. 8 is a perspective view showing the arrangement of a second embodiment of the present invention.

The probe of the present invention is not limited to the above-mentioned probe for a whole body, but can be applied as a local (e.g., a head) diagnosis probe FIG. 8 illustrates reception probe 41 for a head according to a second embodiment of the present invention. Reception probe 41 comprises square-loop coil members 43A and 43B which vertically extend from two end portions of the plate surface of planar fixing block 42 shown in the lower portion of FIG. 8 to be parallel to each other. Reception probe 41 is used such that the head of patient P is placed on fixing block 42 as shown in FIG. 8. In this case, since there is nothing above the patient's face, the nose of patient P will not abut against probe 41. Since only loop coil members 43A and 43B are present adjacent to the head of patient P, the ears of patient P will not feel cramped, thus allowing easy mounting.

Various other changes and modifications may be made within the spirit and scope of the present invention.

What is claimed is:

1. A probe system, used in a magnetic resonance system, for detecting a magnetic resonance signal which is generated from an object as a result of magnetic resonance, said probe system comprising:

a reception coil consisting of a coil member without a bobbin, said coil member including a rigid portion which determines the shape of said reception coil and a deformable portion which is deformed when said reception coil is fitted around the object, said rigid portion comprising at least two rigid members formed of a conductor which cannot easily be deformed, and said deformable portion comprising a coupling portion for coupling said rigid members, and said reception coil further comprising holding means, arranged adjacent to said coupling portion, for causing said rigid members to hold a predetermined positional relationship in close proximity with said object.

2. A probe according to claim 1, wherein said coupling portion includes means for electrically connecting said rigid members with each other.

3. A probe according to claim 1, wherein said coupling portion is formed of a flexible conductor for coupling said rigid members.

4. A probe according to claim 3, wherein said flexible conductor is a copper foil.

5. A probe according to claim 3, wherein said flexible conductor is a conductor braid.

6. A probe according to claim 1, wherein said rigid members are two saddle coils forming a pair of saddle portions.

7. A probe according to claim 2, wherein said rigid members are formed of a conductor pipe, said conductor pipe being a copper pipe.

8. A probe system, used in a magnetic resonance system, for detecting a magnetic resonance signal which is generated from an object as a result of magnetic resonance, said probe system comprising:

a reception coil consisting of a coil member without a bobbin, said coil member including a rigid portion which determines the shape of said reception coil and a deformable portion which is deformed when said reception coil is fitted around object, said rigid portion comprises at least two rigid members formed of a conductor which cannot easily be deformed, and said deformable portion comprise a coupling portion for flexibly coupling said rigid members, and said reception coil further comprises holding means, arranged adjacent to said coupling portion, for causing said rigid members to hold a predetermined positional relationship, said coupling portion is formed of a flexible conductor for coupling said rigid members, said flexible conductor being a copper foil.

9. A probe system, used in a magnetic resonance system, for detecting a magnetic resonance signal which is generated from an object as a result of magnetic resonance, said probe system comprising:

a reception coil consisting of a coil member without a bobbin, said coil member including a rigid portion which determines the shape of said reception coil and a deformable portion which is deformed when said reception coil is fitted around the object, said rigid portion comprises at least two rigid members formed of a conductor which cannot easily be deformed, and said deformable portion comprises a coupling portion for flexibly coupling said rigid members, and said reception coil further comprises holding means, arranged adjacent to said coupling portion, for causing said rigid members to hold a predetermined positional relationship, said rigid members are two saddle coils forming a pair of saddle portions.

* * * * *